(12) United States Patent
Tani

(10) Patent No.: US 6,234,080 B1
(45) Date of Patent: May 22, 2001

(54) METHOD AND APPARATUS FOR CLEANING SCREEN USED IN SCREEN PRINTING MACHINE

(75) Inventor: Okie Tani, Tokyo (JP)

(73) Assignee: Tani Denkikogyo Co. Ltd, Tokyo (JP)

( * ) Notice: Subject to any disclaimer, the term of this patent is extended or adjusted under 35 U.S.C. 154(b) by 0 days.

(21) Appl. No.: 09/419,180

(22) Filed: Oct. 15, 1999

(30) Foreign Application Priority Data

Oct. 16, 1998 (JP) .................................................. 10-331854

(51) Int. Cl.$^7$ ....................................................... B41F 35/00
(52) U.S. Cl. ............................ 101/424; 101/425; 134/93; 134/199
(58) Field of Search ................................... 101/423, 424, 101/425; 134/93, 198, 199

(56) References Cited

U.S. PATENT DOCUMENTS 5,860,361 * 1/1999 Nanjyo et al. ........................ 101/424
5,976,269 * 11/1999 Hamasaki et al. .................... 101/425

FOREIGN PATENT DOCUMENTS 55-002041  1/1980 (JP) .
58-132562  8/1983 (JP) .
07314653  12/1995 (JP) .
08039786  2/1996 (JP) .

* cited by examiner

Primary Examiner—Ren Yan
(74) Attorney, Agent, or Firm—Collen Law Associates, P.C.; Robert M. McDermott

(57) ABSTRACT

The invention encompasses method and apparatus for cleaning screen used in screen printing machine for printing of solder paste onto a surface of a printed circuit board. The apparatus includes two upper and lower cleaning chambers 4, 5 which are provided on upper and lower sides of the screen 2 in opposed relationship with each other in such a manner that the two chambers are in watertight contact with the upper and lower surfaces 2A, 2B, of screen 2, respectively and are communicated with each other through openings 2C in the screen 2. The upper and lower cleaning chambers are essential components of the apparatus for carrying out cleaning the solder paste residue adhered to inner peripheral surfaces of the openings 2C in the screen 2 as well as the solder paste residue adhered to the upper and lower surfaces 2A, 2B from the screen 2. A wash liquid supply means is provided for supplying wash liquid into each of the chambers 4, 5 to wash away the past residues adhered to the screen 2.

9 Claims, 9 Drawing Sheets

METHOD AND APPARATUS FOR CLEANING SCREEN USED IN SCREEN PRINTING MACHINE

BACKGROUND OF THE INVENTION

1. Field of the Invention

The present invention relates generally to printing of viscous materials onto a surface through a screen having a plurality of openings therein, and more particularly to method and apparatus for cleaning paste residues from screens used in producing surface mount technology circuit boards suitable for use in high technology products.

2. Description of the Prior Art

Screens used in producing such circuit boards require frequent cleaning because viscous printing material, including solder paste, is caused to remain not only on screen surfaces, but also in openings in the screen during repeated printing. If the printing is further continued, the remaining solder paste as paste residue will cause defective printing such as blot, blur, discontinuity of line, or the like, of a paste pattern printed on the circuit board. On the other hand, to meet the rapid development of the electronics industry, a screen is required to obtain high resolution. That is, the area of opening pattern on the screen and the space between adjacent openings in the screen tend to be reduced. Such a tendency makes it difficult to effectively remove solder paste residues from the screen, particularly the residues that adhere to inner peripheral surfaces of small or reduced openings in the screen.

There are various methods and apparatuses by which solder paste residues that are adhered to the screen can be removed. One approach is to wipe off the residues by applying paper to the screen surfaces. Another approach is to scrape off the residues by scraper means. However, it is impossible for these approaches to remove the residues in the openings in the screen. Another approach is to use an airstream. In this approach, the residues in the openings can be relatively easily removed when the residues are soft. In this approach, however, when the residues adhered to the surfaces of the openings in the screen are solidified or dried, or when the residue is clogged in a small-sized opening in the screen, it is extremely difficult to clean them from the screen.

To overcome drawbacks or disadvantages indicated by these approaches, methods and apparatuses for cleaning screens by using a water-based solvent as a wash liquid have recently been proposed. With this type of method for cleaning a screen, most of the above-mentioned drawbacks or disadvantages can be eliminated. However, the use of a cleaning solvent causes environmental and personal injury resulting from solvent release into the atmosphere, and worker exposure to solvent vapors. Furthermore, solder paste residue contains lead that is removed from the screen during cleaning, and worker exposure to lead is a health concern which must be seriously addressed.

A known apparatus of this type is schematically shown as PRIOR ART 1 in FIG. 11. As shown therein, the known apparatus is provided with a cleaning reservoir 103 with its upper end opened and has therein two inwardly directed mutually opposed spray nozzles 131 for spraying cleaning solvent against both surfaces of the screen 105 which is vertically held between the nozzles 131 during cleaning. Numeral 132 shown in FIG. 11 indicates drier nozzles. Another known apparatus of the type mentioned above is also schematically shown as PRIOR ART 2 in FIG. 12. As shown therein, the apparatus is provided with a box-like housing 200 having an opening at its upper wall through which a screen 205 is vertically inserted into the housing 200 for cleaning. In the housing 200 there are provided two spray nozzles 201, 202 for spraying the solvent against both surfaces of the screen 205, which is vertically held between the nozzles 201, 202 during cleaning. The upper opening of the housing may be closed and opened and is closed in the manner shown in FIG. 12 during cleaning. Numerals 203, 204 show drier nozzles for drying the screen 205 after spraying is finished.

A common feature of these known apparatuses is that the screen is held in an erect position during cleaning. Other common features are that the apparatus is installed outside a screen printing machine, that the apparatus becomes bulky as a whole, due to its abovementioned structures, and cannot be incorporated into a screen printing machine, and, accordingly, that it cannot be used for cleaning of the screen during paste printing cycles performed by the machine.

SUMMARY OF THE INVENTION

The present invention is intended to eliminate the drawbacks or disadvantages indicated with the known methods and apparatuses as described above and to provide improved method and apparatus for cleaning the screen used in a screen printing machine.

It is, therefore, one object of the present invention to provide a method and an apparatus for cleaning a screen used in a screen printing machine, which are capable of preventing environmental injury resulting from cleaning solvent release into the atmosphere, and, of protecting workers from being exposed to detrimental substances within solder paste residue, such as lead.

Another object of the invention is to provide a method and an apparatus of the kind described above, which are capable of efficiently removing the paste residue from the screen.

A further object of the invention is to provide an apparatus of the kind stated above which is capable of being incorporated into a screen printing machine, and which permits automated cleaning of the screen during screen printing cycles performed by the machine.

It is another object of the invention to provide an apparatus of the kind described above which includes two easily replaceable cleaning chamber units, which can be replaced with other different sizes of cleaning chamber units, depending on the size of the screen used for screen printing.

It is a further object of the invention to provide an apparatus of the kind stated above which includes a cleaning chamber in which a rotatable mechanical means for creating a turbulence, as well as rotational motion in the wash liquid injected into the chamber, so that cleaning effect as well as cleaning efficiency can be accelerated.

It is another object of the invention to provide an apparatus of the kind stated above which includes a cleaning chamber in which a vibrator means for imparting vibratory movement to the screen that is immersed in the wash liquid that is injected into the chamber so that cleaning effect as well as cleaning efficiency can be accelerated.

It is a further object of the invention to provide an apparatus of the kind stated above which includes a cleaning chamber in which a pneumatic means for creating a turbulence, as well as fluctuation, in the wash liquid that is injected into the chamber, so that cleaning effect as well as cleaning efficiency can be enhanced.

The various features of novelty which characterize the invention are pointed out with particularity in the claims annexed to and forming a part of this disclosure. For a better understanding of the invention, its advantages and specific objects attained by its uses, reference is made to the accompanying drawings and descriptive matter in which a paste residue cleaning apparatus for carrying out the cleaning method is illustrated.

DETAILED DESCRIPTION OF THE PREFERRED EMBODIMENTS

Figure 1:
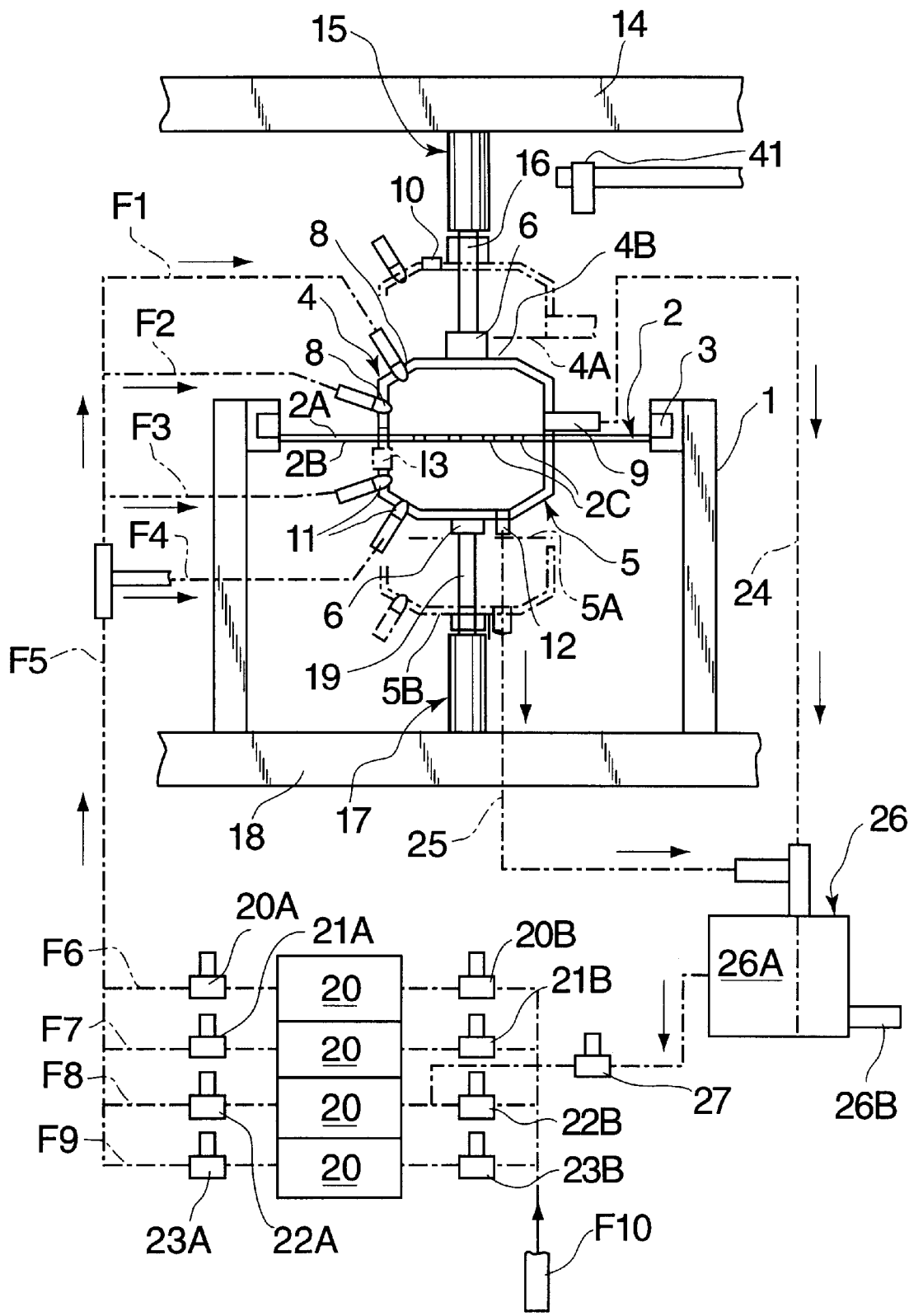
FIG. 1 is a schematic elevation of a screen cleaning apparatus as one embodiment of the present invention.

Referring to FIG. 1 which shows an apparatus for cleaning of a screen as one embodiment of the present invention, reference numeral 1 indicates a supporting frame of a screen printing machine for supporting a metal screen 2 having therein a plurality of pattern openings 2C through which solder paste is printed onto a printed circuit board, not shown, by means of a squeegee, not shown. The screen 2 is horizontally held in a tensioned state by a screen holder 3 that is removably secured to the supporting frame 1.

The apparatus includes two upper and lower cleaning chambers 4, 5, which are provided on upper and lower sides of the screen 2 in opposed relationship with each other, for cleaning the solder paste residue adhered to inner peripheral surfaces of the openings 2C in the screen 2,as well as the solder paste residues adhered to the upper and lower surfaces 2A, 2B of the screen 2. Each of the cleaning chambers 4, 5 is formed by a shell structure which can be made from either synthetic resin or metal, such as stainless steel and is formed symmetrically with each other.

Figure 2:
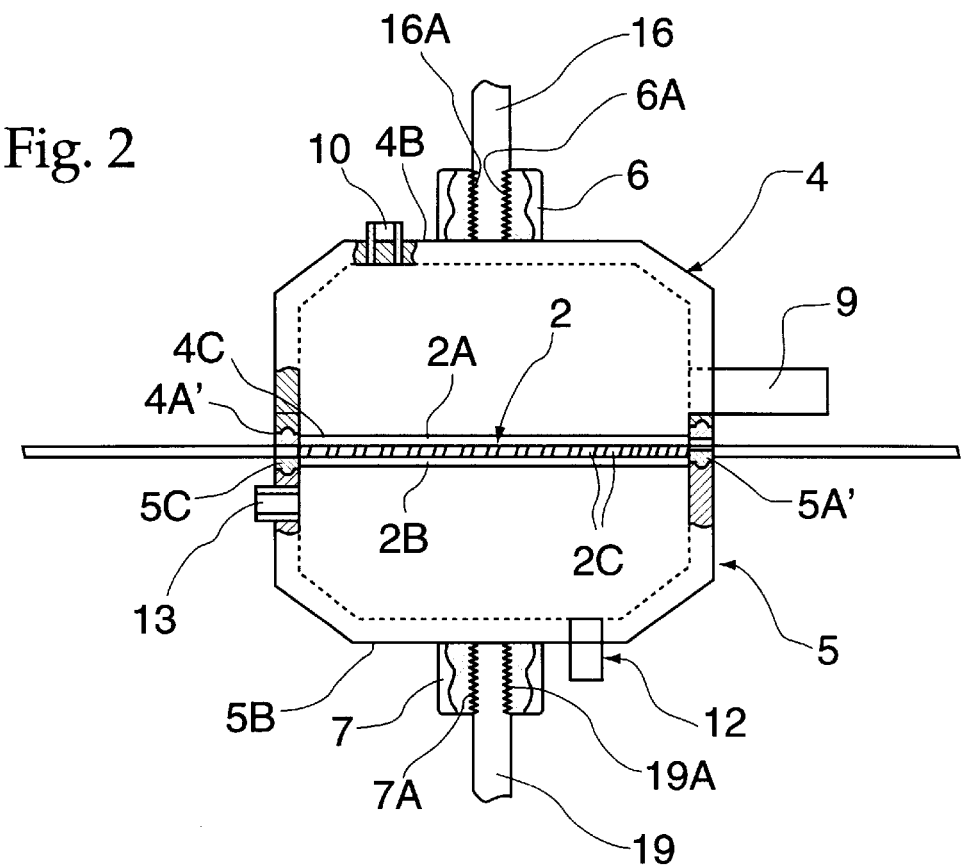
FIG. 2 is a partly cross-sectioned schematic front view of a pair of cleaning chambers, from which fluid injection nozzles are removed, as essential components of the cleaning apparatus of the present invention, illustrating the state in which a screen to be cleaned is hermetically nipped by the cleaning chambers.

The upper cleaning chamber 4 opens fully to the outside through an opening 4A on its lower face and is provided, at its top surface 4B, with a boss 6 having female threads 6A therein, as shown in FIG. 2. On the other hand, the lower cleaning chamber 5 opens fully to the outside through an opening 5A on its upper face, and is provided, at its lower bottom surface 5B, with a boss 7 having male threads 7A therein, as shown in FIG. 2. As clearly shown in FIGS. 2 and 3, the upper cleaning chamber 4 is provided, at its lower opening edge 4A', with a seal member 4C which is fixedly secured thereto. Similarly, the lower cleaning chamber 5 is provided, at its upper opening edge 5A', with a seal member 5C which is fixedly secured thereto.

Indicated by reference numeral 8 are fluid injection nozzles which project into the upper cleaning chamber 4 through its wall and are directed toward the upper surface 2A of screen 2. Numeral 9 indicates a drain pipe connected to the upper chamber 4 for draining the liquid which has been used for cleaning of the screen 2 from said chamber. Numeral 10 shows a vent. Numeral 11 indicates fluid injection nozzles that project into the lower cleaning chamber 5 through its wall and are directed toward the lower surface 2B of screen 2. The nozzles 11 may be of rotatable or tiltable structure. Numeral 12 is a drain pipe connected to the lower chamber 5 for draining the liquid used for cleaning of the screen 2 from said chamber. Numeral 13 is a vent.

Suspended vertically from an overhead frame member 14 of the printing machine is a pneumatic cylinder 15 having a piston rod 16 from which suspends the upper cleaning chamber 4 that moves vertically. As shown in FIG. 2, the piston rod 16 has, at its lower end portion, male threads 16A which engage with the female threads 6A of said boss 6 so that by bringing the male threads 16A into threaded engagement with the female threads 6A, the upper cleaning chamber 4 can be vertically moved and removed while held by the piston rod 16 of pneumatic cylinder 15. Indicated by numeral 17 is a pneumatic cylinder mounted uprightly on a lower frame member 18 of the machine and having a piston rod 19 that moves vertically to support the lower cleaning chamber 5. As shown in FIG. 2, the piston rod 19 has, at its upper end portion, male threads 19A which engage with the female threads 7A of said boss 7 so that by bringing the male threads 19A into threaded engagement with the female threads 7A, the lower cleaning chamber 5 can be moved vertically supported by the piston rod 19 of pneumatic cylinder 17.

Thus, as shown by dotted lines in FIG. 1, when the apparatus is at rest, the upper cleaning chamber 4 is kept in a raised position above the screen 2, and the lower cleaning chamber 5 is kept in a lowered position. Then, as the apparatus is put into operation, upper cleaning chamber 4 is lowered and creates a sealed contact with the upper surface 2A of screen 2, and lower cleaning chamber 5 is raised and creates a sealed contact with the lower surface 2B of screen 2 by means of the pneumatic actuators 15, 17 respectively, whereby the screen 2 is hermetically nipped, or watertight, by this contact with the upper and lower cleaning chambers 4, 5 as shown by solid lines in FIGS. 1 and 2.

Each of the cleaning chambers 4, 5 is connected with fluid sources, not shown, via fluid circuits including liquid circuits and compressed air circuits. FIG. 1 shows one example of the fluid circuits. In FIG. 1, F1, F2, F3 and F4 show branch pipes that are connected at one end with nozzles 8, 11 and at the other end with a pipe 5, respectively. The pipe 5 is, in turn, connected with pipes F6, F7, F8 and F9 that are connected, on their inlet sides, with a fluid supply duct F10 which is connected to the fluid sources, respectively. Reference numerals 20, 21, 22 and 23 indicate a cool water tank, a warm water tank, a water-based solvent tank, and an air tank, respectively. These tanks 20, 21, 22 and 23 are connected, on their respective inlet and outlet sides, with pipes F6, F7, F8 and F9, respectively Indicated by numerals 20A, 21A, 22A, and 23A are solenoid-actuated valves which are connected with pipes F6, F7, F8 and F9 downstream of the tanks 20, 21, 22 and 23, respectively. Numerals 20B, 21B, 22B and 23B also indicate solenoid-actuated valves which are connected with the pipes upstream of the tanks, respectively. By the provision of the foregoing circuit arrangements, it is possible to selectively supply cool water, warm water, solvent, or compressed air, or a combination of liquid and air to the cleaning chambers 4, 5 for the cleaning of the screen 2 nipped therebetween by selectively operating said solenoid-actuated valves by means of a control unit including a control circuit arrangement, not shown.

Indicated by numerals 24 and 25 are drain pipelines connected, at one end, to the respective drain pipes 9, 12 of cleaning chambers 4, 5 and, at the other ends, to a vacuum or suction device 26 having a filtering chamber 26A and a drain pipe 26B which is connected to a sump tank, not shown. The filtering chamber 26A is connected via a pipe 27 with the pipe F8, which is connected to the solvent tank 22, via a solenoid-actuated valve 27, so that the reusable used wash liquid drained from the upper and lower chambers 4, 5 can be filtered and recirculated.

With the apparatus shown in FIG. 1, the paste residues can be removed from screen 2 either by water-based cleaning solvent or by warm water having a temperature of 50° C. that is injected into the mated cleaning chambers 4, 5, which communicate vertically with each other through openings 2C in screen 2 to wash the screen. In this connection, it is to be noted that when compressed air is introduced into chambers 4, 5 through nozzles 8, 11 after the screen 2 is immersed in the liquid introduced into the chambers 4, 5, the liquid not only generates waves, but is also to be stirred up, thereby causing the paste residues to be washed away from the screen 2. In the case where screen 2 is cleaned by cleaning solvent, the screen 2 can be rinsed out by cooled water or warm water after being cleaned by the solvent, and thereafter it can be dried by applying compressed air, which may be heated to a suitable temperature, to the both surfaces 2A, 2B of screen 2.

Figure 3:
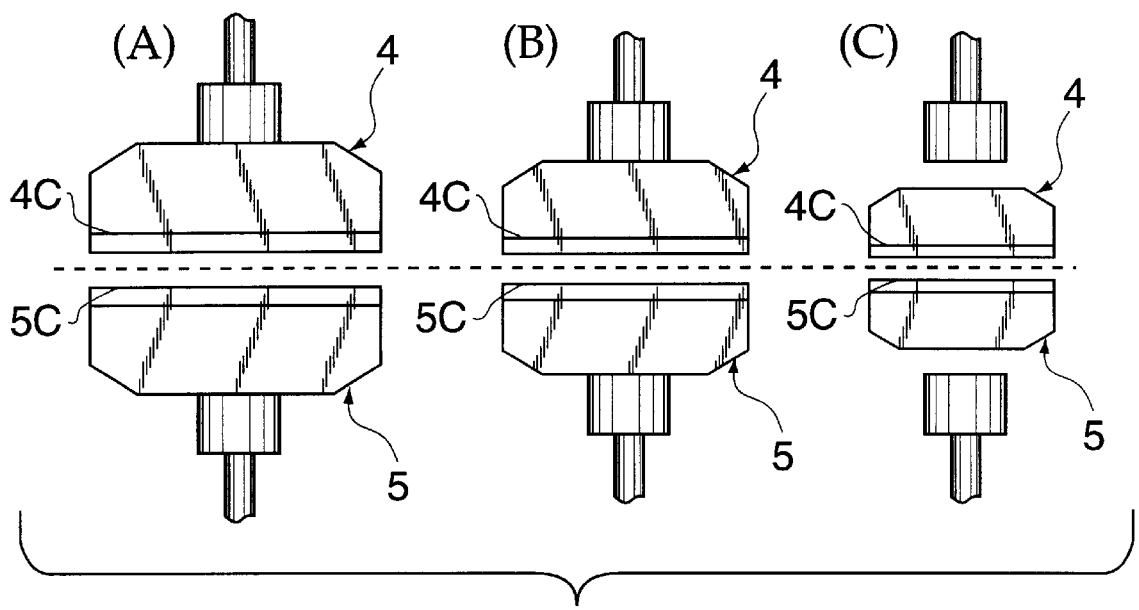
FIG. 3 is a schematic front view of three pairs of cleaning chambers that are mutually replaceably constructed.
Figure 8:
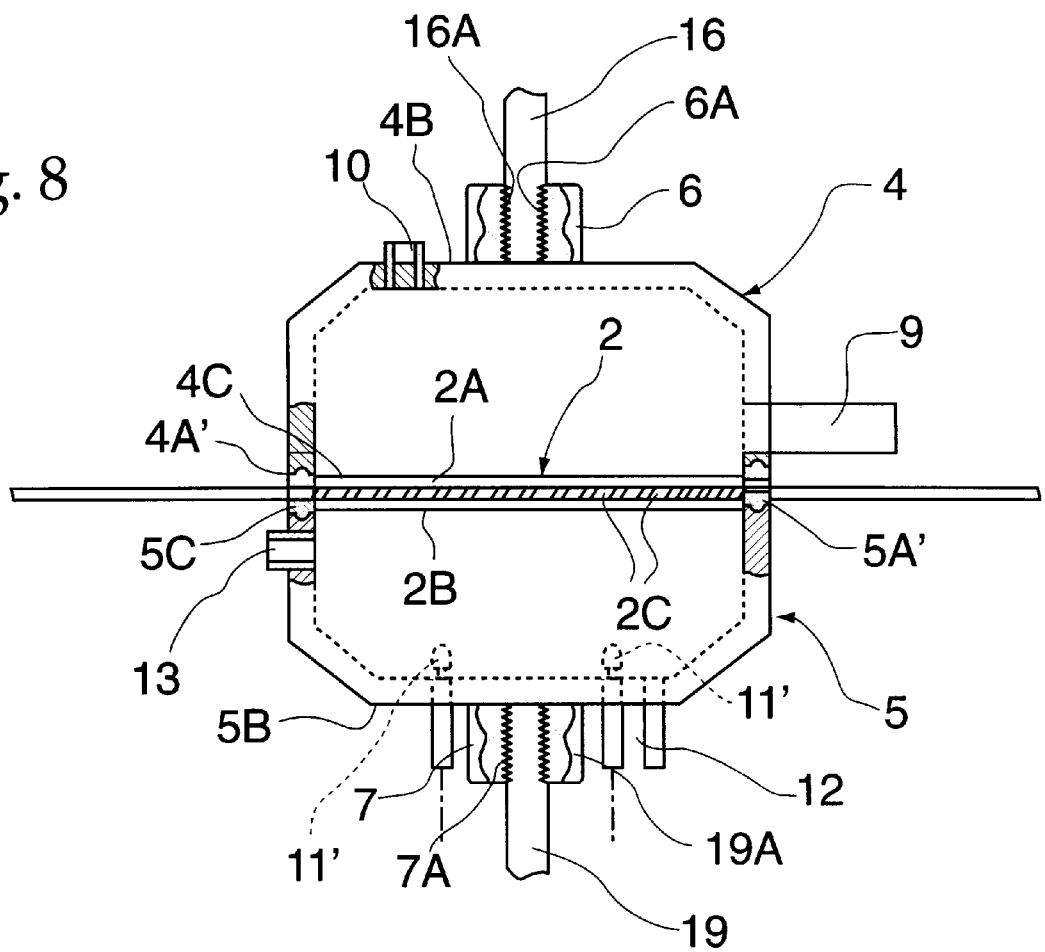
FIG. 8 is a view similar to FIG. 2, illustrating the state in which the lower cleaning chamber is provided, at its bottom portion, with a plurality of upright nozzles which are directed toward a lower surface of the screen.

FIG. 8 shows a variant of the embodiment shown in FIG. 1. In the drawing, the same parts or portions as those shown in FIGS. 1 to 3 are indicated by like numerals. In the apparatus shown in FIG. 8, the lower cleaning chamber 5 is provided, at its bottom portion 5B, with a plurality of upright nozzles 11' which are directed toward the lower surface 2B of screen 2. These nozzles 11' are arranged such that their throttles can be adjusted so that the speed and pressure of the fluid to be injected into the lower chamber 5 may be varied, as occasion demands.

Figure 4:
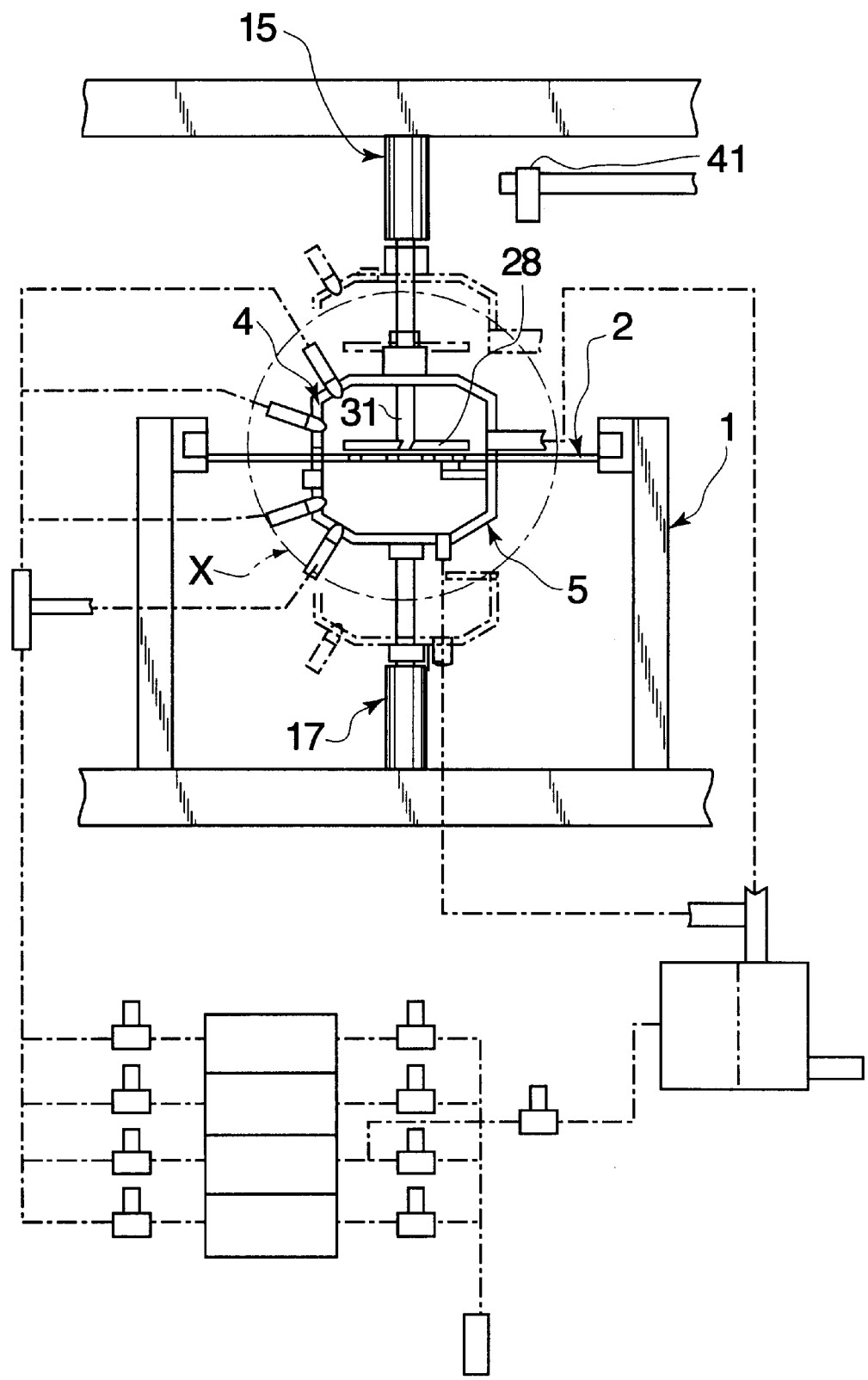
FIG. 4 is a schematic elevation of the screen cleaning apparatus as another embodiment of the invention.
Figure 5:
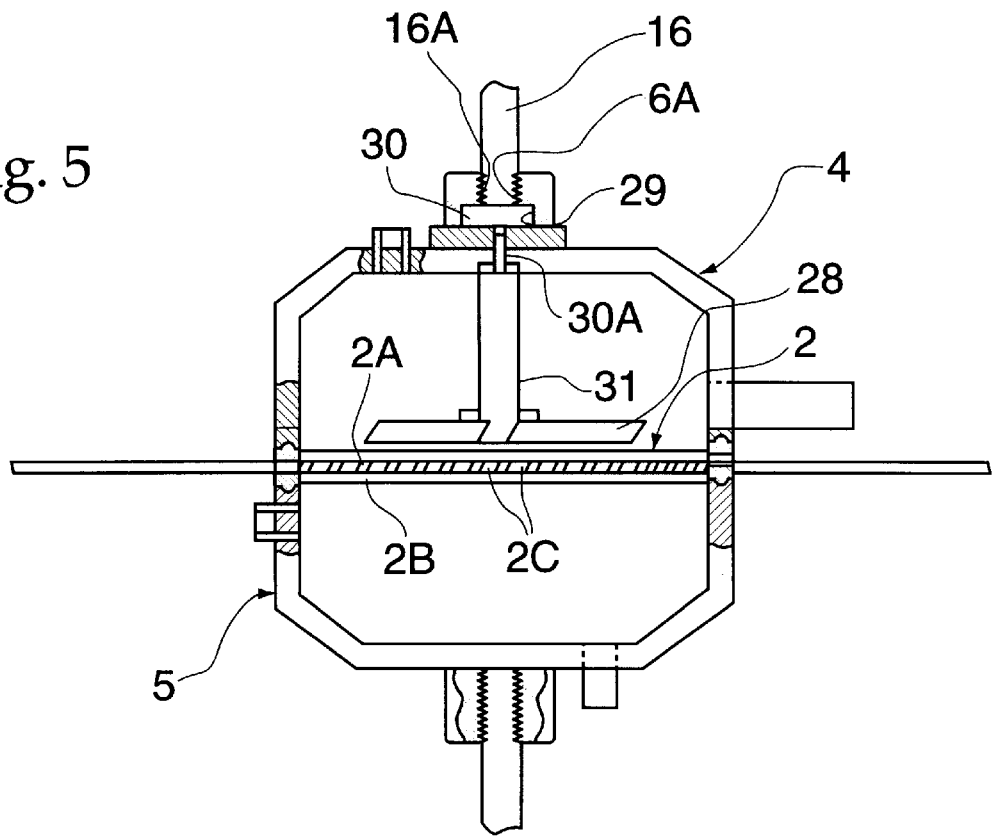
FIG. 5 is a partly cross-sectioned schematic front view of the apparatus' portion as marked "X" in FIG. 4, in an enlarged scale.

Referring now to FIGS. 4 and 5, there is shown a screen cleaning apparatus as another embodiment of the present invention.

This embodiment differs from the first embodiment in that it is equipped, in upper cleaning chamber 4, with a rotatable mechanical means for creating turbulence as well as rotational motion in the wash liquid injected into the chamber.

The rotatable mechanical means takes the form of a propeller-like blade 28 which is rotated about a vertical axis within the chamber 4. As shown in FIG. 5, the boss 6 is formed therein with a space 29 immediately under the female threads 6A and a relatively small electric motor 30 is mounted in the space 29. The blade 28 is fixed to the lower end of a vertically extending rotating shaft 31 the upper end of which is securely mourned on an output shaft 30A of the motor 30, so that when the motor starts rotating, the blade 28 is caused to be driven for rotation. According to this embodiment, cleaning effect as well as cleaning efficiency can be accelerated, since a turbulence as well as rotational motion are created in the wash liquid.

Figure 7:
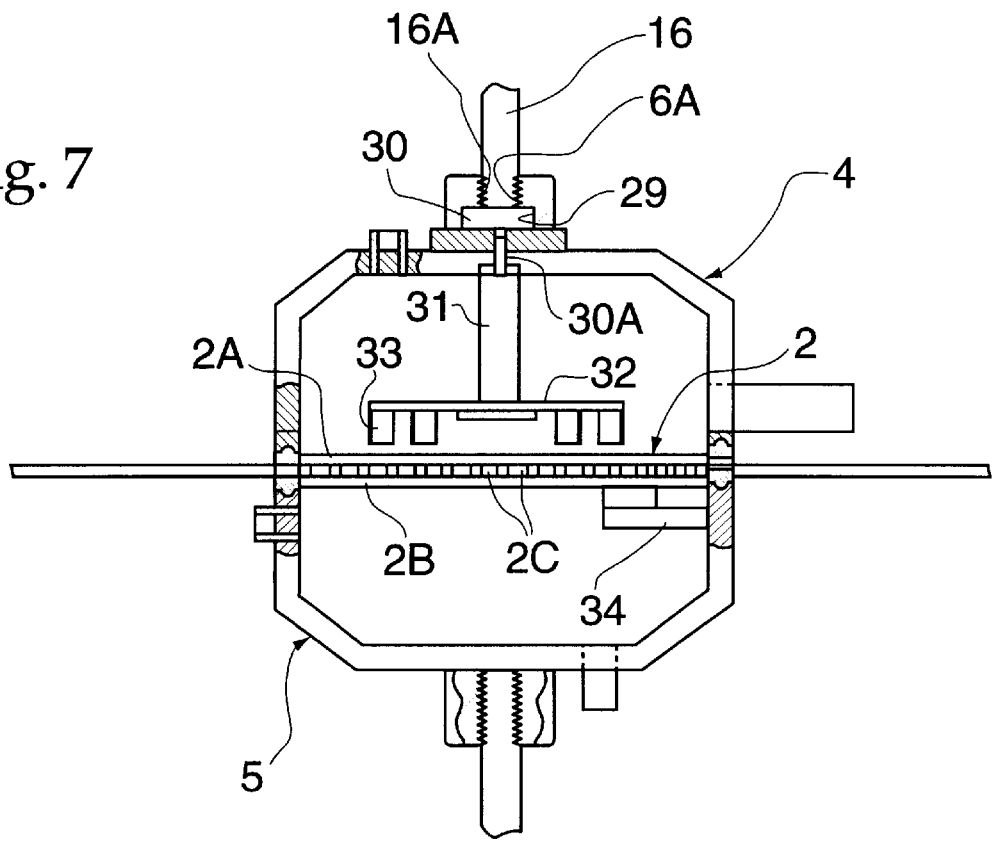
FIG. 7 is a partly cross-sectioned schematic front view of the apparatus' portions marked "Y" in FIG. 6, in an enlarged scale.
Figure 6:
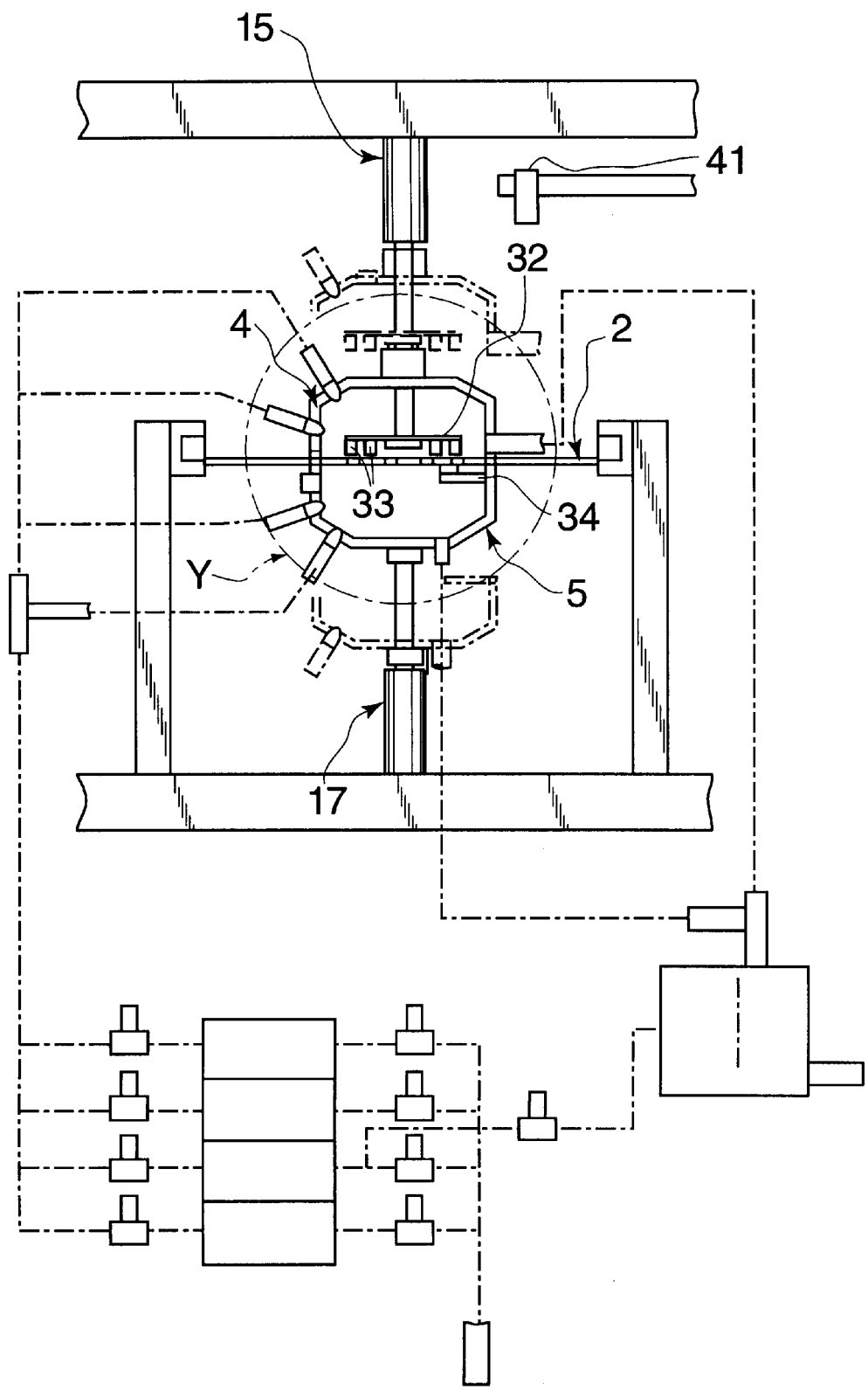
FIG. 6 is the schematic elevation of the screen cleaning apparatus as a further embodiment of the invention.

Referring to FIGS. 6 and 7, there is shown a variant of the embodiment shown in FIGS. 4 and 5. This variant also has in the upper chamber 4 a rotatable mechanical means for creating a turbulence as well as rotational motion in said wash liquid. The rotatable mechanical means comprises a disk plate 32 that is fixed to the lower end of said shaft 31 and a plurality of short blades 33 suspended from the disk plate 32. Also, this variant is provided, in the lower chamber 5, with a vibrator means for creating vibratory movement to screen 2 in the state in which the screen is immersed in the wash liquid. The vibrator means takes the form of an ultrasonic generator 34. When screen 2 is vibrated, vibration of the screen is transmitted to the liquid and creates vibratory movement thereto. According to this variant, since the vibrator means and the rotational mechanical means cooperate with each other in performing washing functions, cleaning effect and cleaning efficiency can be further enhanced.

Figure 9:
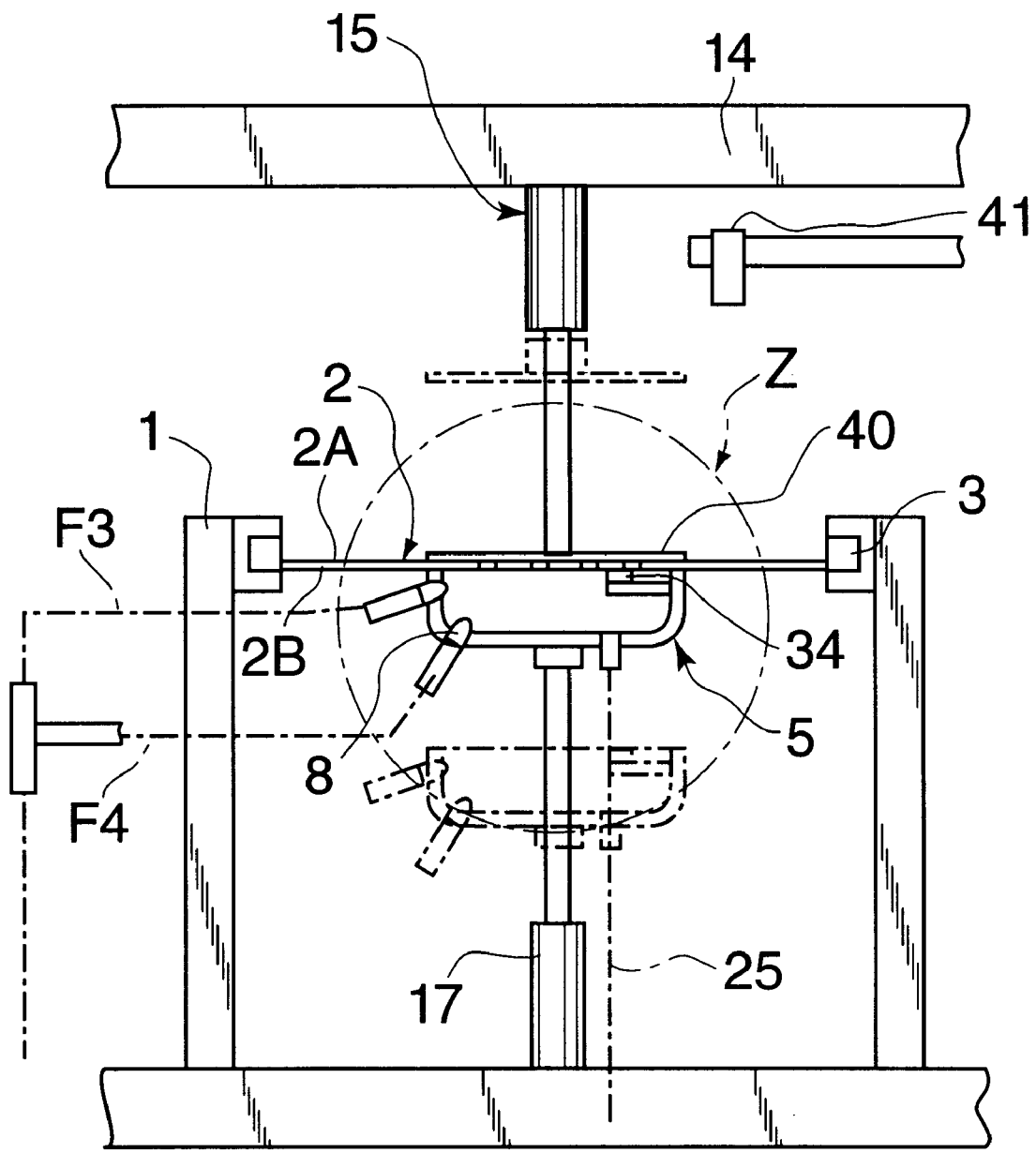
FIG. 9 is a schematic elevation of the screen cleaning apparatus as another embodiment of the invention.
Figure 10:
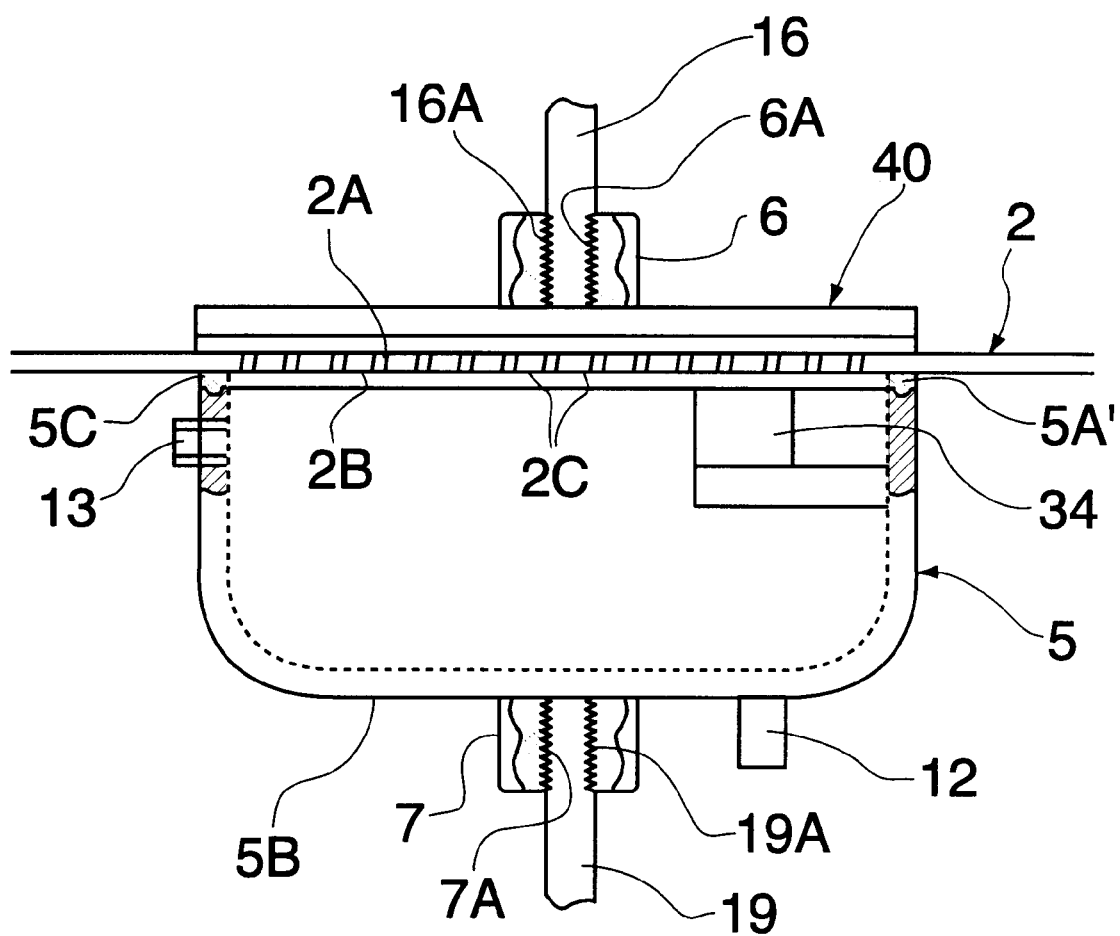
FIG. 10 is a partly cross-sectioned schematic front view of the apparatus' portion as marked "Z" in FIG. 9, in an enlarged scale.
Figure 11:
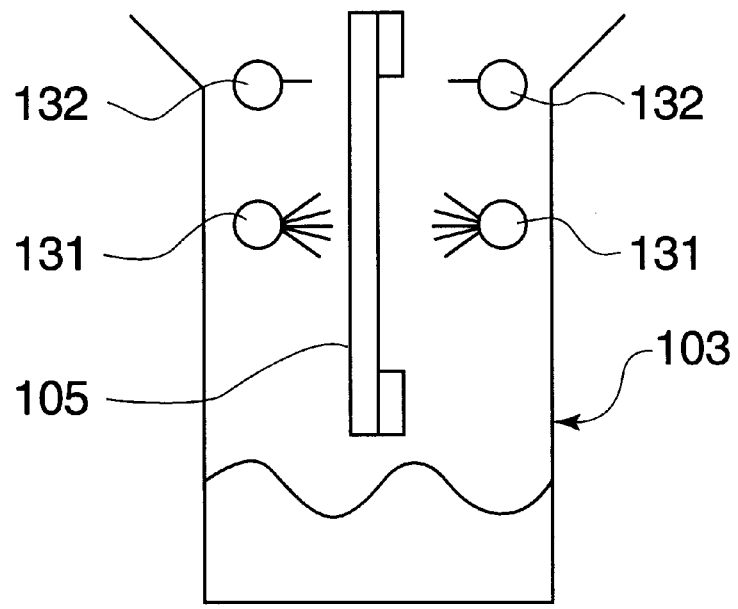
FIG. 11 is a schematic view showing a known screen cleaning apparatus as PRIOR ART 1.
Figure 12:
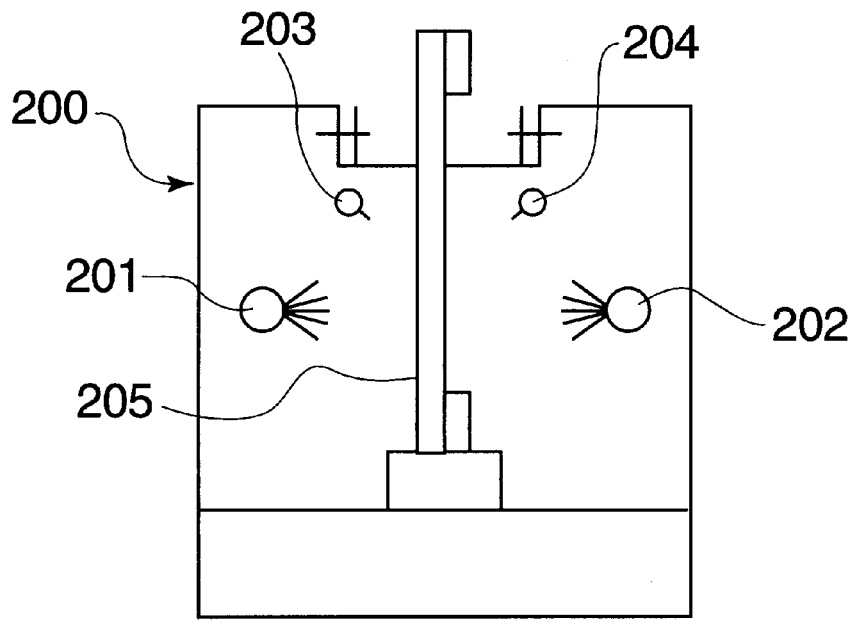
FIG. 12 is a view similar to FIG. 11, showing another known apparatus as PRIOR ART 2.

FIGS. 9 and 10 illustrate another embodiment of the invention. This embodiment is designed to remove the paste residue from the lower surface 28 of and openings 2C in the screen 2. It is provided with a lower cleaning chamber 5 with the same construction as that of the lower chamber 5 of the embodiment shown in FIGS. 7 and 8. A feature of this embodiment is that the embodiment has, instead of the upper cleaning chamber 4, a flat cover member 40 which covers the upper surface 2A of screen 2, which moves vertically and is attached to the pneumatic actuator 15.

Indicated by numeral 41 in FIGS. 1 through 10 is an optical apparatus provided above the screen 2 for the purpose of detecting the effect of screen cleaning after a cleaning cycle has been finished.

It is to be understood that the present invention may be embodied in other specific form without departing from the spirit or essential characteristics of the present invention. The preferred embodiments are therefore to be considered illustrative and not restrictive.

What is claimed is:

1. A method for cleaning a screen used in a screen printing machine for printing paste onto a surface of a board comprising:

providing a pair of cleaning chambers on upper and lower sides of the screen in opposed relationship with each other so that the two chambers are in watertight contact with the upper and lower surfaces of said screen, respectively and are communicated with each other through openings in said screen; and supplying wash liquid into each of said cleaning chambers to form a wash liquid pool to wash away paste residue adhered to inner peripheral surfaces of the openings in said screen as well as paste residue adhered to the upper and lower surfaces of said screen; and creating turbulence and rotational motion in the wash liquid pool, via a rotatable mechanical device provided in at least one of the chambers.

2. An apparatus for cleaning a screen used in a screen printing machine for printing paste onto a surface of a board comprising:

a pair of cleaning chambers provided on upper and lower sides of the screen in opposed relationship with each other so that the two chambers are in watertight contact with the upper and lower surfaces of said screen, respectively and are communicated with each other through openings in said screen; and wash liquid supply means connected to each of said chambers to create a wash liquid pool for supplying wash liquid into each of said chambers to wash away paste residue adhered to inner peripheral surfaces of the openings in said screen as well as paste residue adhered to the upper and lower surfaces of said screen, wherein at least one of the cleaning chambers is provided with a rotatable mechanical device for creating turbulence and rotational motion in the wash liquid pool.

3. The apparatus as claimed in claim 2, wherein an other of the cleaning chambers is provided with a vibrator for imparting vibratory movement to said screen in the state in which it is immersed in the wash liquid supplied into said chamber.

4. An apparatus for cleaning a screen used in a screen printing machine for printing paste onto a surface of a board comprising:

a cleaning chamber provided on a lower side of the screen so that the cleaning chamber is in watertight contact with the lower surface of said screen, a flat cover member for watertightly covering a section of the upper surface of said screen that corresponds to a section of the lower surface thereof where said cleaning chamber is located, wash liquid supply means connected to said chamber and for supplying wash liquid into said chamber to wash away paste residue adhered to inner peripheral surfaces of openings in said screen as well as paste residue adhered to the lower surface of said screen, and draining means for draining the wash liquid which has been used for cleaning of said screen from said chamber.

5. The apparatus as claimed in claim 4, including means for filtering and recirculating used liquid drained from said chamber.

6. A method for cleaning a screen used in a screen printing machine for printing paste onto a surface of a board comprising the steps of providing a pair of cleaning chambers on upper and lower sides of the screen in opposed relationship with each other so that the two chambers are in watertight contact with the upper and lower surfaces of said screen, respectively and are communicated with each other through openings in said screen; and supplying wash liquid into each of said cleaning chambers from wash liquid supply devices connected to each of said chambers to wash away paste residue adhered to inner peripheral surfaces of the openings in said screen as well as paste residue adhered to the upper and lower surfaces of said screen, and imparting vibratory movement in said screen in the state in which it is immersed in the wash liquid, via a vibrator provided in at least one of said chambers.

7. An apparatus for cleaning a screen used in a screen printing machine for printing paste onto a surface of a board comprising:

a pair of cleaning chambers provided on upper and lower sides of the screen in opposed relationship with each other so that the two chambers are in watertight contact with the upper and lower surfaces of said screen, respectively, and are communicated with each other through openings in said screen; and wash liquid supply means connected to each of said chambers and for supplying wash liquid into each of said chambers to wash away paste residue adhered to inner peripheral surfaces of the openings in said screen as well as paste residue adhered to the upper and lower surfaces of said screen, wherein at least one of the cleaning chambers is provided with a vibrator for imparting vibratory movement to the screen in the state in which said screen is immersed in the wash liquid supplied into said chamber.

8. The apparatus as claimed in claim 7, wherein the wash liquid is a water-based solvent with agents for rendering the paste residues soluble in water.

9. The apparatus as claimed in claim 7, wherein an other of the cleaning chambers is provided with a rotatable mechanical device for creating turbulence and rotational motion in the wash liquid supplied into said chamber.

* * * * *